(12) United States Patent
Ganter et al.

(10) Patent No.: US 11,277,939 B2
(45) Date of Patent: Mar. 15, 2022

(54) EVAPORATOR AND MANUFACTURING METHOD

(71) Applicant: Hitachi Energy Switzerland AG, Baden (CH)

(72) Inventors: Philipp Ganter, Klettgau (DE); Andreas Hiller, Nussbaumen (CH); Francesco Agostini, Zürich (CH)

(73) Assignee: Hitachi Energy Switzerland AG, Baden (CH)

( * ) Notice: Subject to any disclaimer, the term of this patent is extended or adjusted under 35 U.S.C. 154(b) by 42 days.

(21) Appl. No.: 16/748,088

(22) Filed: Jan. 21, 2020

(65) Prior Publication Data

US 2020/0232688 A1 Jul. 23, 2020

(30) Foreign Application Priority Data

Jan. 22, 2019 (EP) .................................... 19152962

(51) Int. Cl.
*H05K 7/20* (2006.01)
*F25B 39/02* (2006.01)
*F28F 1/02* (2006.01)

(52) U.S. Cl.
CPC ....... *H05K 7/20309* (2013.01); *F25B 39/024* (2013.01); *F28F 1/022* (2013.01);
(Continued)

(58) Field of Classification Search
CPC ................ F25B 39/024; F25B 2339/02; F25B 2339/041; F25B 2339/043; F28D 1/0206;
(Continued)

(56) References Cited

U.S. PATENT DOCUMENTS

2003/0136549 A1* 7/2003 Sone ................... F28D 15/0266
165/104.21
2008/0062694 A1 3/2008 Lai et al.
(Continued)

FOREIGN PATENT DOCUMENTS

CN 1551969 A 12/2004
CN 202738351 U 2/2013
(Continued)

OTHER PUBLICATIONS

European Search Report dated Jul. 29, 2019 for European Patent Application No. 19152962.7, 2 pages.
(Continued)

*Primary Examiner* — Eric S Ruppert
*Assistant Examiner* — Hans R Weiland
(74) *Attorney, Agent, or Firm* — Sage Patent Group

(57) ABSTRACT

An evaporator includes an inlet in a lower manifold, an outlet in an upper manifold, and a multiport tube extending between the lower manifold and the upper manifold. The multiport tube provides a flow path between the lower manifold and the upper manifold. One of the outer side walls of the multiport tube is provided with a first evaporator section with a first heat receiving surface and a second evaporator section with a second heat receiving surface, the first and second evaporator sections passing a heat load received via the respective first and second heat receiving surfaces to a fluid in said multiport tube. The first and second heat receiving surfaces form an angle with each other to align with and contact different surfaces of an object to be cooled.

17 Claims, 3 Drawing Sheets

(52) U.S. Cl.
CPC ..... *F25B 2339/02* (2013.01); *F25B 2339/041* (2013.01); *F25B 2339/043* (2013.01)

(58) Field of Classification Search
CPC ................ F28D 1/047; F28D 1/05366; F28D 2021/0029; F28D 2021/0064; F28F 1/022; F28F 1/04; H05K 7/20309; H05K 7/20509; H05K 7/20936
See application file for complete search history.

(56) References Cited

U.S. PATENT DOCUMENTS

| | | | | |
|---|---|---|---|---|
| 2013/0104592 | A1* | 5/2013 | Cottet | F28D 15/0266 62/419 |
| 2013/0126143 | A1* | 5/2013 | Sheu | F28F 1/00 165/177 |
| 2014/0151007 | A1* | 6/2014 | Quesada Saborio | F28F 1/022 165/181 |
| 2016/0174414 | A1* | 6/2016 | Molitor | H05K 7/20336 361/673 |
| 2016/0242320 | A1* | 8/2016 | Agostini | F28D 15/0266 |
| 2017/0202108 | A1* | 7/2017 | Torresin | H05K 7/20309 |
| 2019/0017740 | A1* | 1/2019 | Fei | F28F 1/04 |
| 2019/0215988 | A1* | 7/2019 | Wu | F28D 15/0233 |
| 2019/0259632 | A1* | 8/2019 | Isaacs | H01L 23/3677 |
| 2019/0376561 | A1* | 12/2019 | Quist | F28F 9/013 |

FOREIGN PATENT DOCUMENTS

| | | |
|---|---|---|
| CN | 105115345 A | 12/2015 |
| CN | 204923585 U | 12/2015 |
| CN | 105783552 A | 7/2016 |
| CN | 207994007 U | 10/2018 |
| DE | 202014002477 U1 | 6/2014 |
| EP | 1832831 A2 | 9/2007 |
| EP | 1832833 A2 | 9/2007 |
| EP | 1860523 A2 | 11/2007 |
| EP | 3185664 A1 | 6/2017 |
| JP | 2010169289 A | 8/2010 |
| JP | 5250210 B2 | 7/2013 |

OTHER PUBLICATIONS

Chinese First Office Action dated Mar. 30, 2021 for Chinese Patent Application No. 202010074122.0, 4 pages (incliuding English translation).

* cited by examiner

EVAPORATOR AND MANUFACTURING METHOD

RELATED APPLICATION

This application claims priority under 35 U.S.C. § 119 from European Patent Application No. 19152962.7, filed on Jan. 22, 2019, the disclosure of which is hereby incorporated by reference herein as if set forth in its entirety.

BACKGROUND

The present disclosure relates to an evaporator and more particularly, to an evaporator which during use contacts a surface of an object to be cooled.

In order to ensure that heat generated by an object is efficiently passed to an evaporator contacting this object, it is necessary to ensure that the thermal connection between the object and the evaporator is sufficiently good. Additionally, the evaporator should have a sufficient cooling capacity to remove the heat load generated by the object.

In praxis, it is difficult to provide such an evaporator, in particular when the object to be cooled has an outer shape where a single sufficiently large flat surface area does not exist. With such an object, the available area of the flat surface section may not be sufficient to provide the required cooling. Instead it becomes necessary to use an evaporator capable of following the shape of the outer surface of the object also beyond the available flat surface section of the object.

A challenge in cooling such an object is, however, that the design of the previously known evaporators is far from optimal in order to provide adequate cooling for such objects.

SUMMARY

An object of the present inventive concepts is to solve the above-mentioned drawback and to provide an evaporator capable of provide efficient cooling to an object. An evaporator includes an inlet in a lower manifold, an outlet in an upper manifold, and a multiport tube extending between the lower manifold and the upper manifold. The multiport tube provides a flow path between the lower manifold and the upper manifold. One of the outer side walls of the multiport tube is provided with a first evaporator section with a first heat receiving surface and a second evaporator section with a second heat receiving surface, the first and second evaporator sections passing a heat load received via the respective first and second heat receiving surfaces to a fluid in said multiport tube. The first and second heat receiving surfaces form an angle with each other to align with and contact different surfaces of an object to be cooled.

When the evaporator is provided with a multiport tube which is provided with a first evaporator section and a second evaporator section that have a respective first and a second heat receiving surface that form an angle with each other, the evaporator is capable of contacting different surfaces of the object to be cooled, and therefore to provide adequate cooling.

A method of manufacturing an evaporator according to some embodiments includes extruding a multiport tube with a plurality of separate flow channels which are delimited by outer opposite side walls and internal intermediate walls extending between the outer opposite side walls of the multiport tube, providing a lower manifold with an inlet at first end of the multiport tube, providing an upper manifold with an outlet at a second end of the multiport tube, and bending the multiport tube to provide a first evaporator section with a first heat receiving surface and a second evaporator section with a second heat receiving surface such that the first and second heat receiving surfaces form an angle with each other.

BRIEF DESCRIPTION OF DRAWINGS

In the following description, embodiments will be described in closer detail by way of example and with reference to the attached drawings, in which.

DESCRIPTION OF EMBODIMENTS

Figure 1:
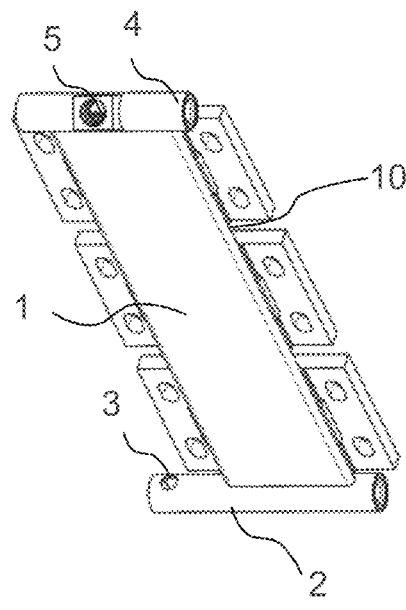
FIGS. 1 to 3 illustrate a method of manufacturing an evaporator.
Figure 2:
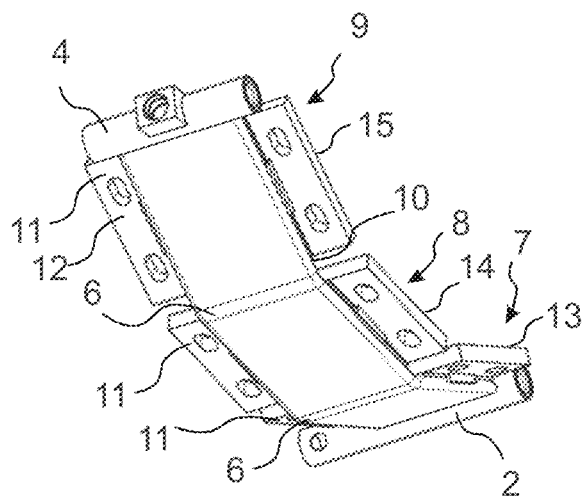
Figure 3:
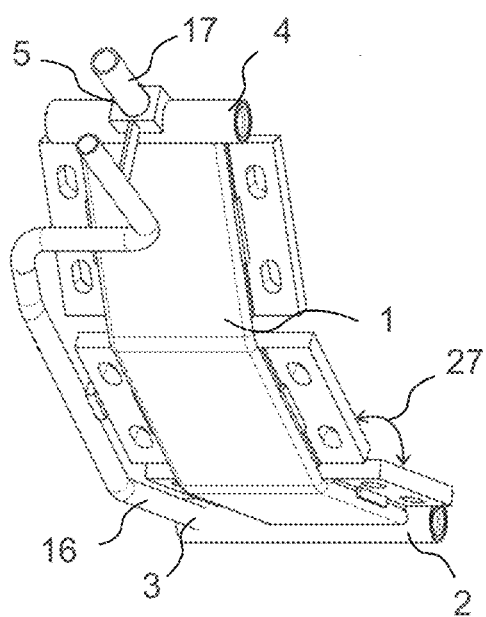

FIGS. 1 to 3 illustrate a method of manufacturing an evaporator and where the different components of the evaporator assembly are shown. In FIG. 1 a multiport tube 1 has been extruded of aluminum, for instance. The multiport tube comprises a plurality of separate flow channels delimited by internal intermediate walls, as best seen in FIG. 5b.

A lower manifold 2 with an inlet 3 is provided at a first end of the multiport tube 1. An upper manifold 4 with an outlet 5 is provided at a second end of the multiport tube 1. Consequently, the multiport tube 1 provides a flow path between the lower manifold 2 and upper manifold 4 to allow fluid having entered the evaporator via the inlet 3 to proceed upwards towards the outlet 5 due to evaporation. Once the parts of the evaporator have been assembled together as illustrated in FIG. 1, the parts may be brazed to each other.

In FIG. 2 manufacturing of the evaporator continues by bending the multiport tube 1 such that at least two evaporator sections are obtained. To facilitate such bending, the multiport tube is manufactured of a metallic material (such as aluminum) with a dimension that allows bending. In the illustrated example, however, bending is carried out at two different locations 6 such that a first evaporator section 7, a second evaporator section 8 and a third evaporator section 9 are provided on an outer side wall 10 of the multiport tube 1. In the figures it is by way of example assumed that the bending is carried out at locations 6 around axis that are parallel. However, in praxis the axis around which bending is implemented at locations 6 need not to be parallel, in which case 3D bending is obtained. Additionally, instead of bending at two locations 6 only, bending can be implemented at more than two locations 6 such that more than three evaporator sections are obtained. This makes it possible to efficiently follow the shape of an object to be cooled which has several surfaces separated by corners that need cooling.

Figure 4:
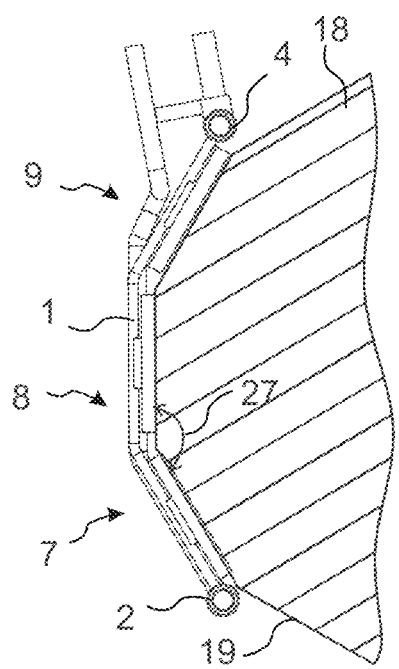
FIG. 4 illustrates the evaporator of FIGS. 1 to 3 when attached to an object to be cooled.

In the illustrated example, it is by way of example, assumed that a metal plate 11 is attached to the outer side wall 10 of the multiport tube 1 at each one of the first, second and third evaporator sections 7, 8 and 9. In that case these metal plates form the respective evaporator sections 7, 8 and 9. A first surface 12 of each metal plate 11 is attached to the outer side wall 10 of the multiport tube 1. Another surface of each metal plate, which is opposite to the first surface 12, forms a heat receiving surface which contacts an object to bee cooled, as illustrated in FIG. 4. Consequently, in the illustrated embodiment, the first evaporator section 7 is formed by a first metal plate 11 having a first heat receiving surface 13, the second evaporator section 8 is formed by a second metal plate 11 having a second heat receiving surface 14, and the third evaporator section 9 is formed by a third metal plate 11 having a third heat receiving surface 15. All metal plates may be manufactured of aluminum, for instance. If metal plates are used, they may be attached to the multiport tube by brazing, for instance, in the manufacturing step illustrated in FIG. 1.

Use of metal plates 11 as the first, the second and the third evaporator sections is, however, not necessary in all embodiments though this is advantageous in many implementations to improve heat spreading and to obtain uniform heat distribution. If such metal plates are not used, surface areas of the outer side wall 10 of the multiport tube 1 as such, may form the first, the second and the third heat receiving surfaces 13, 14 and 15 which receive heat from the object to be cooled and pass the heat load to fluid in the channels of the multiport tube to cause evaporation of the fluid. In that case, the multiport tube of the evaporator may be directly clamped to the object once manufacturing of the evaporator has been finalized.

In the illustrated example, the first, the second and the third heat receiving surfaces 13, 14 and 15 are plane, in other words flat surfaces. Such an embodiment is very advantageous in case the object to be cooled has several flat surfaces as the first, second and third heat receiving surfaces can then be aligned with the surfaces of the object, as illustrated in FIG. 4, to efficiently contact and receive heat from the flat surfaces of the object. The possibility of bending the multiport tube 1 into practically any desired angle 27 at the locations 6, such that the first, second and third heat receiving surfaces 13, 14 and 15 form any suitable angle 27 with each other, makes it possible to adopt the shape of the evaporator efficiently to the shape of the outer surface of the object to be cooled.

In the manufacturing step of FIG. 3 the evaporator is finalized by attaching an inlet tube 16 to the inlet 3 in the lower manifold 2. In the illustrated embodiment, the inlet tube 16 extends upwards from the inlet 3 such that fluid entering the inlet tube in liquid state from a condenser, for instance, will flow into the lower manifold 2 due to gravity. Additionally, an outlet tube 17 is attached to the outlet 5 in the upper manifold 4. The outlet tube extends upwards from the outlet 5 such that fluid entering the outlet tube in vapour state will flow upwards to a condenser, for instance. Consequently, the evaporator is suitable to be used in a cooling system capable of operating in a natural circulation mode together with a condenser without a need for a pump that generates fluid circulation. Finally as a last manufacturing step, to ensure that the evaporator is as rigid as required, the parts of the evaporator may be attached to each other by welding, if necessary.

FIG. 4 illustrates the evaporator of FIGS. 1 to 3 when attached to an object 18 to be cooled. The object 18 may be a circuit breaker unit of a generator, for instance. Alternatively, the object may be any other high voltage and/or high current device requiring efficient cooling. The thermal power loss and heat flux at the evaporator may be for instance as follows:

|  | Q_loss [W]<br>Thermal power losses | q"_loss_aver [W/cm2]<br>Heat flux at evaporator |
| --- | --- | --- |
| Minimum | 100 | 0.10-0.15 |
| Average | 800 | 0.90-1.10 |
| Maximum | 2500 | 2.80-3.50 |

In FIG. 4 it is by way of example assumed that the object 18 has an octagonal shape, which means that the outer surface 19 of the object 18 has a plurality of plane surfaces which form an angle with each other. None of the surfaces alone is sufficiently large to dissipate the entire heat load generated by the object. However, attaching the evaporator explained in connection with FIGS. 1 to 3 to the object 18 as illustrated in FIG. 4, makes it possible to efficiently cool three different surfaces of the object 18. Consequently, a sufficient cooling can be provided due to the first, the second and the third evaporator sections 7, 8 and 9 having the first, the second and the third heat receiving surfaces 13, 14 and 15 perfectly aligned and in contact with the different plane sections of the outer surface of the object. The multiport tube 1 of the evaporator provides a large boiling surface and an optimal flow distribution of the fluid.

The illustrated evaporator also has a certain amount of flexibility, which can be utilized to align the heat receiving surfaces 13, 14 and 15 with the surfaces of the object 18, in case these surfaces are not perfectly aligned after the above explained manufacturing method. In this way a need for separate thermal pads between the heat receiving surfaces 13, 14 and 15 and the surfaces of the object 18 can be eliminated.

Figure 8:
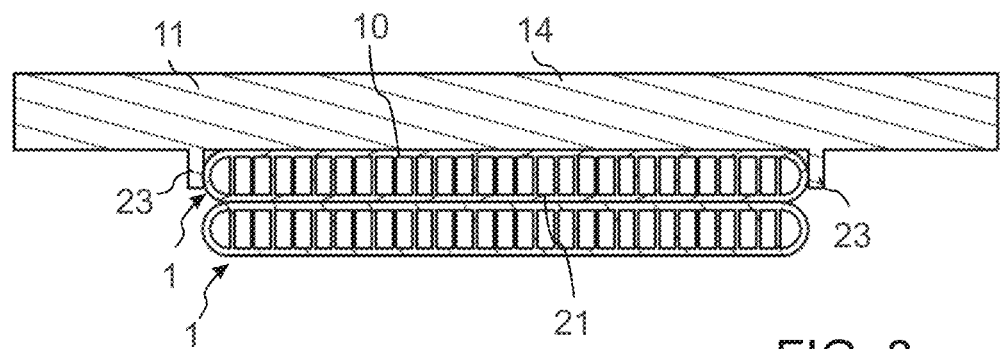
FIG. 8 illustrates a fourth embodiment of an evaporator.

In the embodiment illustrated in FIGS. 1 to 4, the evaporator is provided with one multiport tube 1 only. However, in case more efficient cooling is required, an additional multiport tube (or several tubes) may be arranged in parallel with the illustrated multiport tube 1 to provide a fluid path capable of transferring more fluid between the lower manifold 2 and the upper manifold 4. In this connection the term parallel refers to the fact that these multiport tubes provided parallel fluid paths for fluid between the lower manifold 2 and upper manifold 4. In that case, if metal plates 11 are used, the additional multiport tube (or tubes) may be in contact with the same metal plates 11 as the illustrated multiport tube 1, or alternatively provided with separate additional metal plates. In case several multiport tubes are arranged to extend between the lower manifold 2 and the upper manifold 4, these tubes may be arranged side by side with gaps between them, or alternatively stacked on top of each other, as illustrated in FIG. 8.

Figure 5A:
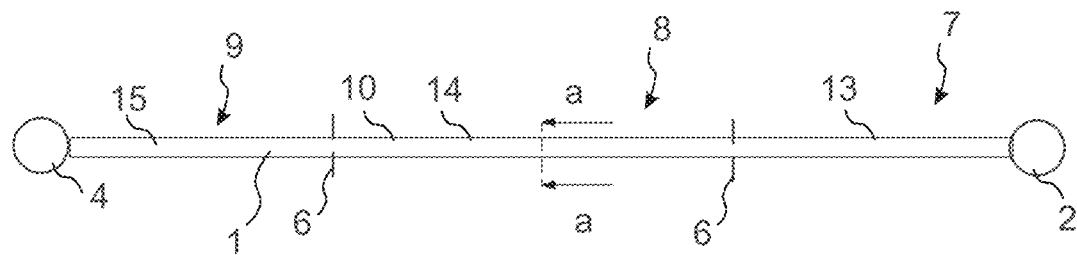
FIGS. 5a and 5b illustrate first embodiment of an evaporator.
Figure 5B:
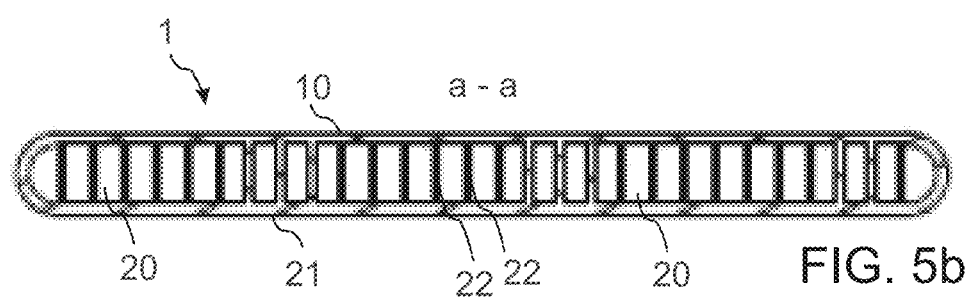

FIGS. 5a and 5b illustrate a first embodiment of an evaporator. FIG. 5a illustrates a side view of the lower manifold 2, the upper manifold 4 and the multiport tube 1 before the multiport tube is bent at locations 6. For simplicity, the inlet, inlet tube, outlet and outlet tube are not illustrated. FIG. 5b illustrates a cross-section of the evaporator at location a-a of FIG. 5a.

In the example of FIGS. 5a and 5b, the evaporator is implemented without the metal plates 11 as shown in FIGS. 1 to 4. Consequently, in use the first, the second and the third heat receiving surface 13, 14 and 15 on the outer side wall 10 of the multiport tube 1 are brought into contact with the object to be cooled.

FIG. 5b also illustrates in detail the flow channels of the multiport tube 1. As can be seen from FIG. 5b, the multiport tube 1 is provided with a plurality of separate flow channels 20 which are delimited by outer opposite side walls 10, 21 and internal intermediate walls 22 extending between the outer opposite side walls 10 and 21 of the multiport tube. Such a multiport tube 1 may be extruded from aluminum, for instance.

Figure 6A:
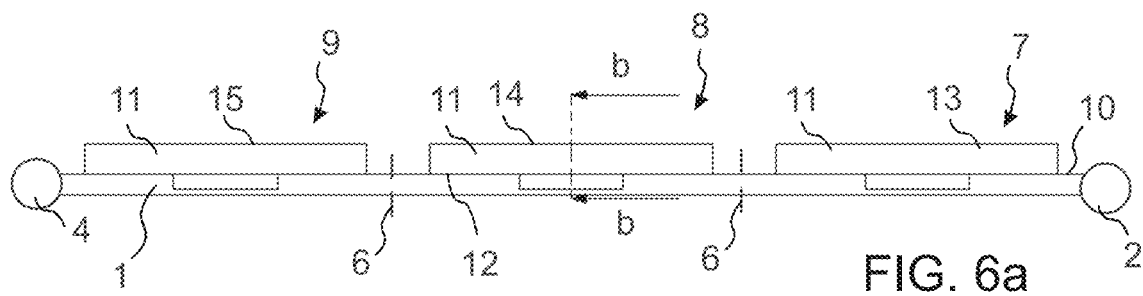
FIGS. 6a and 6b illustrate a second embodiment of an evaporator.
Figure 6B:
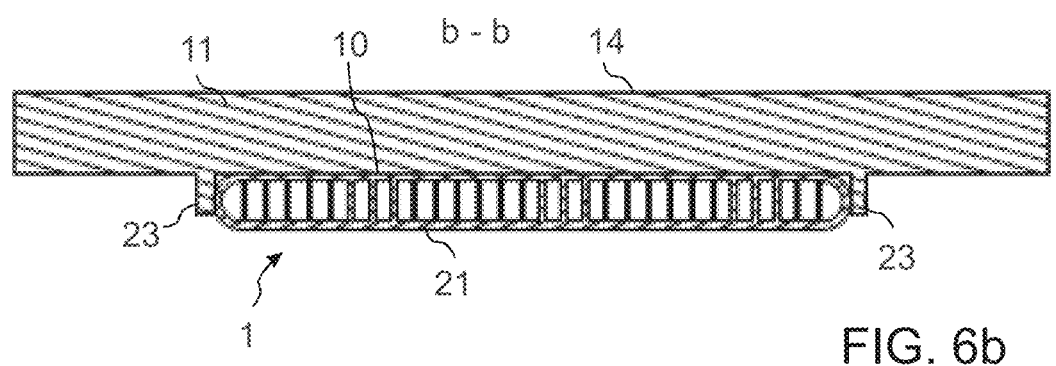

FIGS. 6a and 6b illustrate a second embodiment of an evaporator. The embodiment of FIGS. 6a and 6b is very similar as the one explained in connection with FIGS. 5a and 5b. Therefore, in the following the embodiment of FIGS. 6a and 6b is mainly explained by pointing out the differences between these embodiments.

FIG. 6a illustrates a side view of the lower manifold 2, the upper manifold 4 and the multiport tube 1 before the multiport tube is bent at locations 6. For simplicity, the inlet, inlet tube, outlet and outlet tube are not illustrated. FIG. 6b illustrates a cross-section of the evaporator at location b-b of FIG. 6a.

In the example of FIGS. 6a and 6b, the evaporator is implemented with the metal plates 11 as shown in FIGS. 1 to 4. In FIGS. 6a and 6b these metal plates have a direct contact with the outer side wall 10 of the multiport tube 1. In use the first, the second and the third heat receiving surface 13, 14 and 15 of the metal plates 11 are brought into contact with the object to be cooled, as illustrated in FIG. 4. In the example illustrated in FIG. 6b, the metal plate 11 is attached to the multiport tube by brazing at locations 23, in other words in vicinity of the opposite outer edges of the outer side walls 10 and 21 of the multiport tube 1.

Figure 7A:
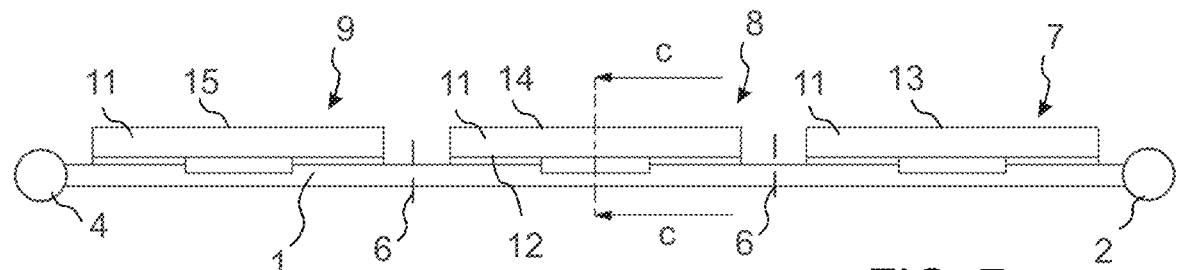
FIGS. 7a and 7b illustrate a third embodiment of an evaporator.
Figure 7B:
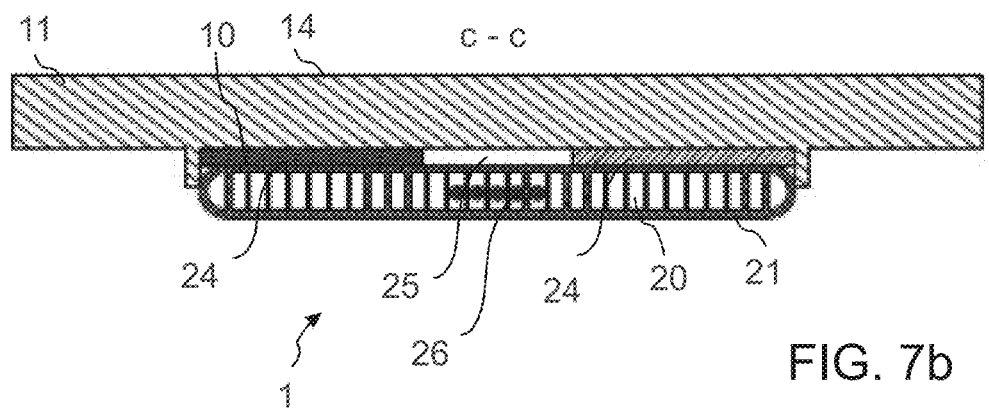

FIGS. 7a and 7b illustrate a third embodiment of an evaporator. The embodiment of FIGS. 7a and 7b is very similar as the one explained in connection with FIGS. 6a and 6b. Therefore, in the following the embodiment of FIGS. 7a and 7b is mainly explained by pointing out the differences between these embodiments.

FIG. 7a illustrates a side view of the lower manifold 2, the upper manifold 4 and the multiport tube 1 before the multiport tube is bent at locations 6. For simplicity, the inlet, inlet tube, outlet and outlet tube are not illustrated. FIG. 7b illustrates a cross-section of the evaporator at location c-c of FIG. 7a.

In the example of FIGS. 7a and 7b, the evaporator is implemented with the metal plates 11 as shown in FIGS. 1 to 4. In FIGS. 7a and 7b the metal plates have an indirect contact with the outer side wall 10 of the multiport tube 1. In use the first, the second and the third heat receiving surface 13, 14 and 15 of the metal plates 11 are brought into contact with the object to be cooled, as illustrated in FIG. 4.

In the example illustrated in FIG. 7b, the metal plate 11 is attached to the multiport tube 1 by brazing at locations 24. Due to brazing, a first and second material layer is formed at locations 24 in a space between the metal plate 11 and the side wall 10 of the multiport tube 1 in vicinity of the opposite outer edges of the outer side wall 10 of the multiport tube. These material layers provide the indirect contact between the metal plate 11 and the outer side wall 10 of the multiport tube 1. The first and the second material layer delimit an air channel 25 between them allowing air to pass between the outer side wall 10 and the metal plate 11. As heat is conducted from the plate 11 to the channels 20 of the multiport tube 1 more efficiently via the material layers at locations 24 than via the air channel 25, a group of channels 26 at the location of the air channel provide a route for liquid backflow. Such backflow may originate from a condenser to which the evaporator is connected, for instance.

FIG. 8 illustrates a fourth embodiment of an evaporator. The embodiment of FIG. 8 is very similar as the one explained in connection with FIGS. 6a and 6b. Therefore, in the following the embodiment of FIG. 8 is mainly explained by pointing out the differences between these embodiments.

FIG. 8 illustrates a cross-section of the evaporator. In this example, the evaporator is implemented with the metal plates 11 as shown in FIGS. 1 to 4. These metal plates have a direct contact with the outer side wall 10 of the multiport tube 1. However, in this embodiment an additional multiport tube 1 (or several tubes) is arranged in parallel with the multiport tube 1 contacting the metal plate 11. In this way a fluid path capable of transferring more fluid between the lower manifold and the upper manifold is obtained. In FIG. 8 these multiport tubes 1 are stacked on top of each other. The multiport tubes may be attached to each other by soldering, for instance.

It is to be understood that the above description and the accompanying figures are only intended to illustrate the certain embodiments which can be varied and modified without departing from the inventive concepts.

The invention claimed is:

1. An evaporator comprising:
   an inlet in a lower manifold,
   an outlet in an upper manifold, and
   a multiport tube extending between the lower manifold and the upper manifold, wherein the multiport tube is provided with a plurality of separate flow channels which are delimited by opposing first and second outer side walls and internal intermediate walls extending between the opposing first and second outer side walls of the multiport tube, the multiport tube providing a flow path between the lower manifold and the upper manifold,
   wherein the multiport tube defines a first evaporator section having a first heat receiving surface and a second evaporator section having a second heat receiving surface, the first and second evaporator sections passing a heat load received via the respective first and second heat receiving surfaces to a fluid in said multiport tube,
   wherein the first and second heat receiving surfaces form an angle with each other to align with and contact different surfaces of an object to be cooled;
   wherein the first evaporator section comprises a first metal plate having a first surface affixed to the multiport tube and a second surface, which is opposite to the first surface and which forms the first heat receiving surface of the first evaporator section;
   wherein the second evaporator section comprises a second metal plate having a first surface affixed to the multiport tube and a second surface, which is opposite to the first surface and which forms the second heat receiving surface of the second evaporator section, and
   wherein the first metal plate and the second metal plate are separated from one another.

2. The evaporator according to claim 1, further comprising a third evaporator section with a third heat receiving surface passing a heat load received to the fluid in said multiport tube, and wherein the third heat receiving surface forms an angle with the first and second heat receiving surfaces.

3. The evaporator according to claim 2, wherein the first heat receiving surface, the second heat receiving surface and the third heat receiving surface are plane surfaces.

4. The evaporator according to claim 1, further comprising an inlet tube that extends from the inlet and an outlet tube that extends from the outlet.

5. The evaporator according to claim 1, wherein at least one of the first metal plate and the second metal plate is brazed to the multiport tube.

6. The evaporator according to claim 1, wherein at least one metal plate of the first metal plate and the second metal plate is brazed to the first outer side wall of the multiport tube to form a first and second material layer in a space between the at least one metal plate and the first outer side wall of the multiport tube in vicinity of opposite outer edges of the first outer side wall of the multiport tube, said first and second material layer delimiting an air channel allowing air to pass between the first outer side wall and the at least one metal plate.

7. The evaporator according to claim 1, wherein the multiport tube comprises an extruded aluminum tube.

8. The evaporator according to claim 1, wherein said evaporator comprises an evaporator for cooling an object including a circuit breaker unit of a generator.

9. The evaporator according to claim 1, wherein the multiport tube comprises a metallic material dimensioned to be bent at locations between the evaporator sections to define the angle between the first and second heat receiving surfaces.

10. A circuit breaker unit forming an object to be cooled and at least one evaporator according to claim 1 that is thermally connected to said object.

11. A method of manufacturing an evaporator, comprising:
    extruding a multiport tube with a plurality of separate flow channels which are delimited by opposing first and second outer side walls and internal intermediate walls extending between the first and second outer side walls of the multiport tube,
    providing a lower manifold with an inlet at first end of the multiport tube,
    providing an upper manifold with an outlet at a second end of the multiport tube, and
    bending the multiport tube to provide a first evaporator section with a first heat receiving surface and a second evaporator section with a second heat receiving surface such that the first and second heat receiving surfaces form an angle with each other;
    wherein the first evaporator section comprises a first metal plate having a first surface affixed to the multiport tube and a second surface, which is opposite to the first surface and which forms the first heat receiving surface of the first evaporator section;
    wherein the second evaporator section comprises a second metal plate having a first surface affixed to the multiport tube and a second surface, which is opposite to the first surface and which forms the second heat receiving surface of the second evaporator section, and
    wherein the first metal plate and the second metal plate are separated from one another.

12. The method of claim 11, wherein the first evaporator section comprises a plane first heat receiving surface and the second evaporator section comprises a plane second heat receiving surface.

13. An evaporator comprising:
    a first manifold;
    a second manifold; and
    a multiport tube extending between the first manifold and the second manifold, wherein the multiport tube comprises a plurality of separate flow channels for carrying a fluid between the first and second manifolds;
    wherein the multiport tube comprises a first evaporator section having a first heat receiving surface on a first side of the multiport tube and a second evaporator section having a second heat receiving surface on the first side of the multiport tube; and
    wherein the first and second heat receiving surfaces form an angle with each other;
    wherein the first evaporator section comprises a first metal plate having a first surface affixed to the multiport tube and a second surface, which is opposite to the first surface and which forms the first heat receiving surface of the first evaporator section;
    wherein the second evaporator section comprises a second metal plate having a first surface affixed to the multiport tube and a second surface, which is opposite to the first surface and which forms the second heat receiving surface of the second evaporator section, and
    wherein the first metal plate and the second metal plate are separated from one another.

14. The evaporator according to claim 13, wherein the first and second heat receiving surfaces are planar.

15. The evaporator according to claim 13, further comprising:
    a third evaporator section having a third heat receiving surface, wherein the third heat receiving surface forms an angle with the first and second heat receiving surfaces.

16. The evaporator according to claim 13, further comprising an inlet on the first manifold and an outlet on the second manifold.

17. The evaporator according to claim 13, wherein the multiport tube comprises an extruded aluminum tube.

* * * * *